Figure 1:
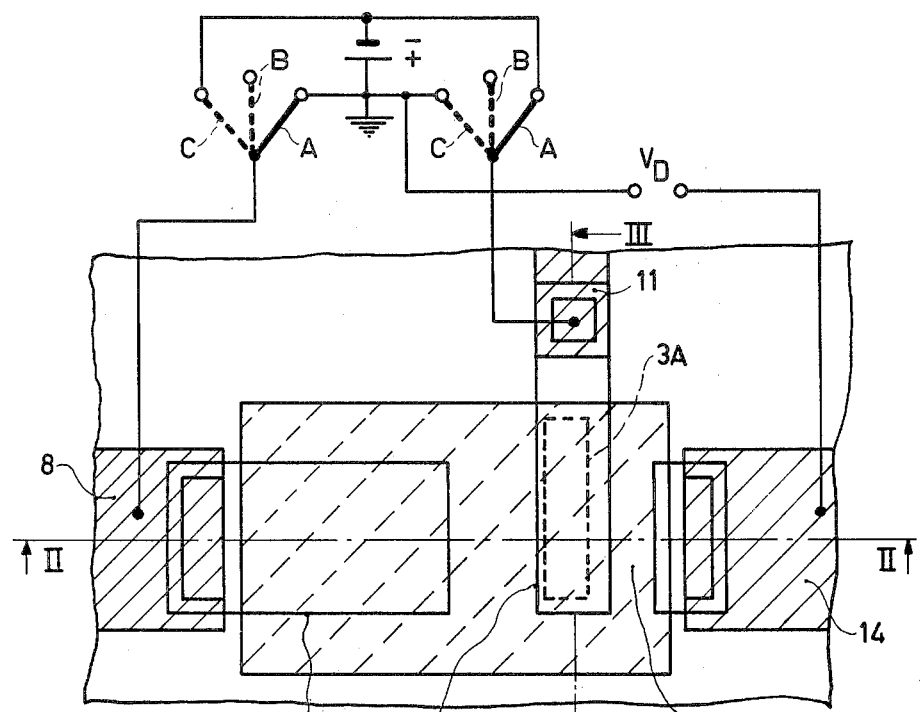

United States Patent [19]

Lohstroh et al.

[11] 4,019,197
[45] Apr. 19, 1977

[54] SEMICONDUCTOR FLOATING GATE STORAGE DEVICE WITH LATERAL ELECTRODE SYSTEM

[75] Inventors: Jan Lohstroh; Roelof Herman Willem Salters, both of Eindhoven, Netherlands

[73] Assignee: U.S. Philips Corporation, New York, N.Y.

[22] Filed: Dec. 4, 1975

[21] Appl. No.: 637,705

[30] Foreign Application Priority Data

Jan. 17, 1975 Netherlands ............... 7500550

[52] U.S. Cl. .................. 357/23; 357/24; 357/12; 357/54; 357/59; 307/304; 340/173 R
[51] Int. Cl.² ............... H01L 29/78; H01L 29/88; H01L 29/34; H01L 29/04
[58] Field of Search .............. 357/23, 24, 54, 59, 357/12; 307/238, 304; 340/183

[56] References Cited

UNITED STATES PATENTS

| 3,755,721 | 8/1973 | Frohman-Bentchkowsky | 357/23 |
| 3,825,945 | 7/1974 | Masuoka | 357/23 |
| 3,825,946 | 7/1974 | Frohman-Bentchkowsky | 357/23 |
| 3,853,496 | 12/1974 | Kim | 357/23 |
| 3,868,187 | 2/1975 | Masuoka | 357/23 |
| 3,890,632 | 6/1975 | Ham et al. | 357/23 |
| 3,909,320 | 9/1975 | Gauge et al. | 357/23 |

OTHER PUBLICATIONS

IBM Technical Disclosure Bulletin, by R. P. James, vol. 16, No. 2, July 1973, pp. 690 and 691.

*Primary Examiner*—Andrew J. James
*Attorney, Agent, or Firm*—Frank R. Trifari; Jack Oisher

[57] ABSTRACT

A semiconductor storage device having a field-effect transistor with a floating insulating gate electrode on which information-containing charge can be stored by tunneling charge carriers between the semiconductor body and the gate electrode. According to the invention the recording and erasing voltage is applied between two juxtaposed surface zones of the same conductivity type present outside the channel region and the source and drain zones, one of the surface zones, which is preferably also the source or drain zone, being separated from the floating gate electrode by an insulating layer having a thickness of less than 0.01 micron through which charge carriers can tunnel. Recording and erasing can be carried out at low voltages and with a voltage source of the same polarity relative to a reference potential.

9 Claims, 10 Drawing Figures

SEMICONDUCTOR FLOATING GATE STORAGE DEVICE WITH LATERAL ELECTRODE SYSTEM

The invention relates to a semiconductor storage device employing a floating gate. Such devices generally comprise a semiconductor region of a first conductivity type, an electrically insulating layer present on a surface of said region and of which at least a part through which charge carriers can tunnel has a thickness of less than 0.01 micron, a first conductive layer (the floating gate) which is present at least on said part of the insulating layer, is enveloped entirely by insulating material, and serves for the storage of information-containing charge, at least a part of which layer forms the gate electrode of an insulated gate field-effect transistor, which first conductive layer is separated from the channel region of the field effect transistor by the said insulating layer, and at least a second conductive layer which has a connection conductor and is separated from the first conductive layer by electrically insulating material.

Semiconductor storage devices of the kind described are known, for example, from Bell Systems Technical Journal 1967, pp. 1288-1295.

In the said known device, a thin (usually only a few tens of Angstrom thick) first insulating layer, a first conductive layer, a second insulating layer and a second conductive layer in this sequence are provided one on top of the other on the channel region of an insulated gate field effect transistor. By applying a voltage to the second conductive layer, charge carriers of one type (electrons or holes) are conveyed to the first conductive layer under the influence of the electric field applied between the channel region and the second conductive layer by tunneling via the thin first insulating layer, in which first conductive layer they are stored as negative or positive charge. After removing the applied voltage, the charge remains on the first conductive layer and leaks away only very slowly since the first conductive layer is enveloped entirely by electrically insulating material. As a result of this, the charge can remain stored on the first conductive layer for a long time, for example, more than a year. The stored charge changes the electrical properties of the field effect transistor, in particular the threshold voltage, that is the minimum voltage which is to be applied to the second conductive layer with respect to the channel region of the field effect transistor so as to bring same from the non-conductive into the conductive state, or conversely, dependent upon whether the field effect transistor is of the enhancement type or of the depletion type. For example, the information stored in the storage element in the form of electric charge can be read by measurement of the threshold voltage of the field-effect transistor. Erasing stored information can be carried out by applying to the second conductive layer a voltage pulse of a polarity which is opposite to that which was used for recording the information.

Rather high voltages are required in the described known devices for recording and erasing information. This is caused by the fact that the electric field which to carry out these operations has to be applied across the thin first insulating layer so as to cause charge carriers to tunnel through said layer, must be obtained indirectly (capacitively) by applying a voltage between the channel region of the field effect transistor and the second conductive layer, thus across the series arrangement of two capacities, since the first conductive layer is enveloped entirely by insulating material and is hence inaccessible. The first capacity is formed by the channel region of the field effect transistor, the first insulating layer present thereon and the first conductive layer, while the second capacity is formed by the first conductive layer, the second insulating layer and the second conductive layer. Since the value of the second capacity is much smaller than that of the first capacity and, in the known devices, cannot or only slightly be increased for reasons to be explained hereinafter, a comparatively high voltage needs to be applied across said second capacity so as to be able to develop a sufficiently high voltage (in practice at least one volt) across the first insulating layer to cause charge carriers to tunnel through said layer and hence to vary the threshold voltage of the field and hence to vary the threshold voltage of the field effect transistor.

The second capacity has a rather low value for two reasons. First of all, in the known device the surface area of the second capacity must be substantially equal to that of the first capacity since the insulating layers and conductive layers are all present above each other on the channel region. So the value of the second capacity can substantially not be increased by increasing its surface area. Furthermore, the second insulating layer is much thicker than the first insulating layer; typically, the first insulating layer consists of an approximately 20 Angstrom thick layer of silicon oxide and the second insulating layer consists of an approximately 800 Angstrom thick layer of silicon nitride. It has been found that in practice the thickness of the second insulating layer cannot be made less than approximately 400 Angstrom without the possibility of the occurrence of pin-holes in the layer which may result in leakage currents. This is associated with the fact that the provision of the second insulating layer generally has to be carried out by pyrolithic deposition from the gaseous phase, in which manner insulating layers are obtained which, in contrast with, for example, layers obtained by chemical conversion of the semiconductor surface, show the required quality only in rather large thicknesses. So substantially no increase of the second capacity can be obtained by reducing the thickness of the dielectric. Another means to increase the value of said second capacity would be the choice of a second insulating layer with very much larger dielectric constant than the first insulating layer, but this has important technological drawbacks, inter alia in that the insulating materials conventionally used in semiconductor technology and comparatively easy to provide and etch, for example, silicon dioxide, silicon nitride and aluminum oxide, do not fulfil said requirements. A further reason why the second insulating layer may not be too thin is that as a result of this the breakdown voltage between the second conductive layer and the channel region would become very low so that damage easily might occur upon accidentally occurring voltage pulses.

As a result of the said causes and the limit which is hence imposed upon the value of the said second capacity, the known storage device, while compact, requires comparatively high voltages to operate (recording and erasing voltage typically of the order of tens of volts).

Another very important drawback of the known storage device is that for recording and erasing information voltage pulses of opposite polarities with respect to the substrate are necessary, which usually required two independent voltage sources. This leads to difficult integration problems and to insulation difficulties.

One of the objects of the invention is to provide a semiconductor storage device which does not show the described drawbacks occurring in known devices or shows said drawbacks only to a considerably reduced extent.

Another object of the invention is to provide a semiconductor storage device in which the recording and erasing of information can be carried out with voltage pulses of the same polarity.

The invention is inter alia based on the recognition of the fact that the provision of the second capacity not above but alongside the first capacity (which in itself is a non-obvious measure since it leads to a slightly less compact structure), provides considerable and unspected electrical and technological advantages, notably a considerable reduction of the required recording and erasing voltages. The invention is also based on the recognition that by providing the thin insulating layer portion through which charge carriers tunnel not on the channel region of the field effect transistor but above a surface zone of a conductivity type opposite to that of the substrate, a structure can be obtained in which for recording and erasing information voltage pulses of the same polarity suffice.

Therefore, a semiconductor storage device of the kind mentioned in the preamble is characterized according to the invention in that the second conductive layer is formed by a first semiconductor surface zone of the second conductivity type which forms a p-n junction with a semiconductor region of the first conductivity type and, in projection, is located outside the channel region of the field-effect transistor, which surface zone is separated from the first conductive layer by an at least 0.01 micron thick part of the insulating layer, that a second surface zone of the second conductivity type is present which forms a p-n junction with the region of the first conductivity type, and is separated from the first conductive layer by a part of the insulating layer which is, at least partly, less than 0.01 micron thick, through which part charge carriers can tunnel. Part of the first conductive layer forms an IGFET gate electrode which is separated from the channel region by a part of the insulating layer which is at least 0.01 micron thick. Electrical connections are made to the first and second surface zones by which voltages can be applied to the device.

Since in the device according to the invention the above-mentioned "second" capacity (the capacity between the first conductive layer and the first surface zone) is not present above but beside the "first" capacity (the capacity between the first conductive layer and the channel region), a much larger degree of freedom is permitted in determining the value of said "second" capacity and same can easily be made so large that only a comparatively low voltage, for example, a few volts, is necessary for recording and erasing information. Although this advantage is obtained at the expense of a slightly less compact structure, it has been found that in most of the cases the resulting advantages amply compensate this. For example, the dielectric for the second capacity may be material which, even in very thin layers, for example, of at most 200 Angstrom (0.02 micron), is sufficiently dense to prevent leakage currents, in particular in those embodiments in which the insulating layer is obtained directly by chemical conversion, for example, by thermal oxidation, of the semiconductor material. In addition, the surface of the second capacity may be made considerably larger than that of the first capacity. In this connection it is pointed out that the insulating layer in various places cannot only be different in thickness but can also be different in composition. For example, the said insulating layer may consist of juxtaposed parts of different materials, while also either everywhere or locally the insulating layer may consist of a combination of layers of different materials present one on top of the other.

A further very important advantage of the device according to the invention is that for recording and erasing information voltage pulses of the same polarity may be used. For example, when the first and second surface zones are p-conductive, information in the form of negative charge can be recorded by applying to the connection conductor of the first surface zone a positive voltage relative to the second surface zone, so that electrons tunnel from the second surface zone through the (thin) insulating layer to the first conductive layer. Conversely, said information can be erased again by applying to the connection conductor of the second surface zone an, again positive, voltage relative to the first surface zone, so that the information-containing electrons of the first conductive layer tunnel back to the second surface zone via the insulating layer.

Another advantage of the device according to the invention is that the insulating material which covers the first conductive layer serving as the floating gate and surrounds same entirely together with the said insulating layer now no longer has the function of a dielectric of one of the said capacities but only serves for insulation. As a result of this the thickness and the surface thereof are hardly of importance any longer for the dielectric properties of the device so that said thickness and surface may be chosen in complete freedom.

The compactness of the device can be considerably increased by constructing it so that the second surface zone of the second conductivity type is also a source or drain zone of the field effect transistor.

It is furthermore to be noted that, although the thin, less than 0.01 micron thick, part of the insulating layer may be present partly below an aperture in the first conductive layer (which aperture of course should be filled with insulation material), said thin part is preferably present entirely below the first conductive layer since the possibility exists that at the area of an aperture as mentioned above charge carriers are captured which can afterwards not be removed and might have an undesired influence on the said threshold voltage.

Figure 2:
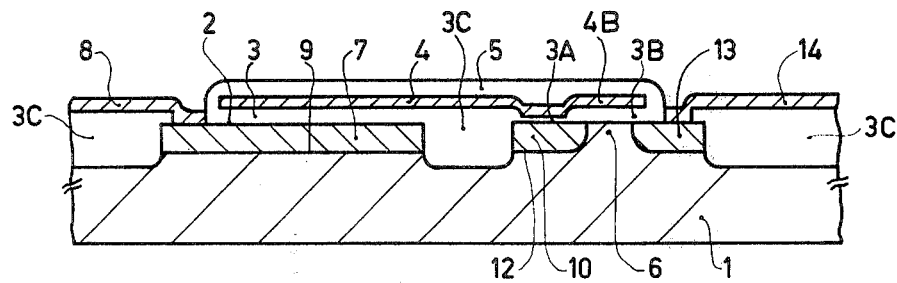
Figure 3:
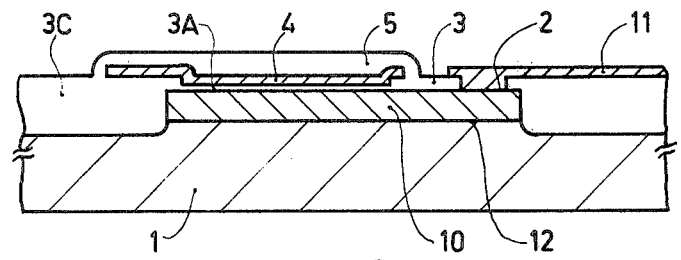
Figure 4:
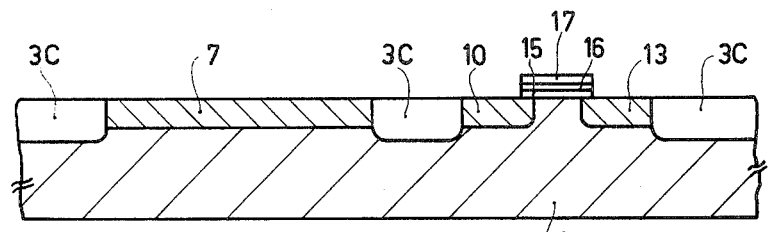
Figure 5:
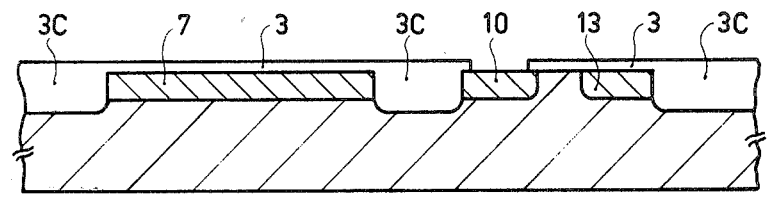
Figure 6:
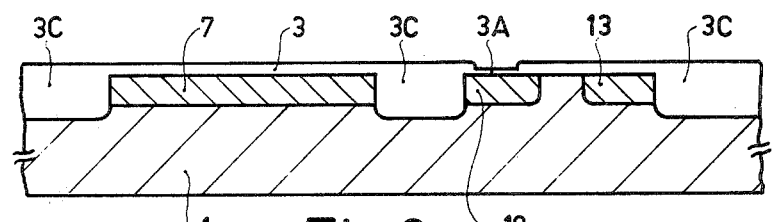
Figure 7:
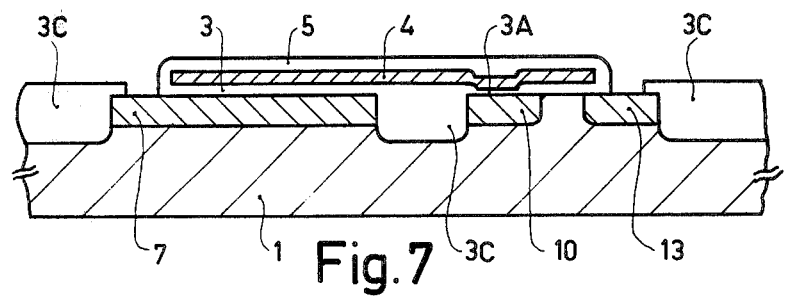
Figure 8:
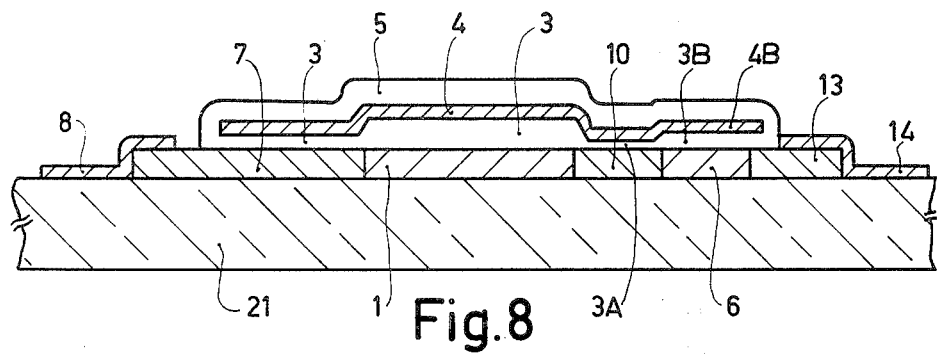
Figure 9:
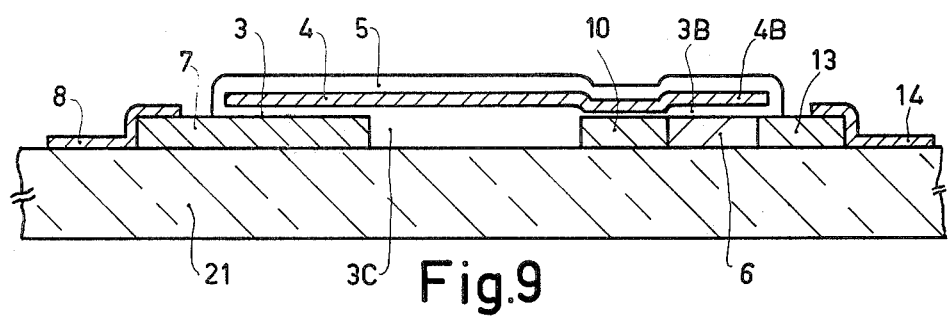
Figure 10:
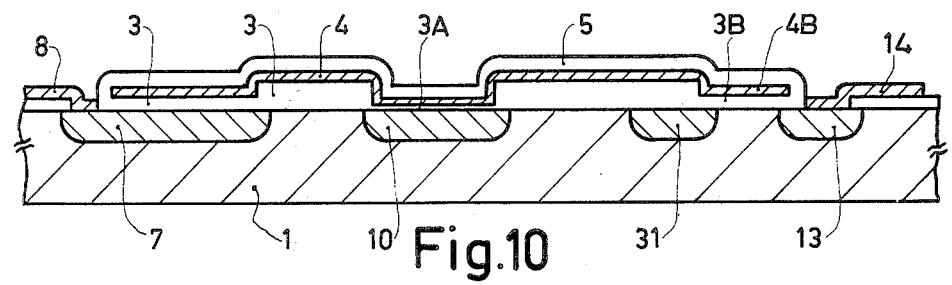

The invention will now be described in greater detail with reference to a few embodiments and the drawing, in which FIG. 1 is a diagrammatic plan view of one form of a device according to the invention, FIGS. 2 and 3 are diagrammatic cross-sectional views of the device shown in FIG. 1 taken on the lines II—II and III—III, FIGS. 4 through 7 are diagrammatic cross-sectional views taken on the line II—II of the device shown in FIGS. 1 through 3 in successive stages of manufacture, and FIGS. 8, 9 and 10 are diagrammatic cross-sectional views of other embodiments of a semiconductor storage device according to the invention.

The figures are diagrammatic and not drawn to scale. Corresponding parts are generally referred to by the same reference numerals. Semiconductor regions of the same conductivity type are shaded in the same direction.

FIG. 1 is a plan view, FIG. 2 is a diagrammatic cross-sectional view taken on the line II—II of FIG. 1, and FIG. 3 is a diagrammatic cross-sectional view taken on the line III—III of FIG. 1 of a semiconductor device according to the invention. The device comprises a semiconductor region 1, in this example consisting of n-type silicon having a resistivity of, for example, 50 ohm.cm, in the form of a semiconductor plate having a thickness of, for example, 200 microns. The surface 2 of the region 1 is covered with an electrically insulating layer 3, in this example of silicon oxide. The insulating layer 3 comprises locally a part 3A in a thickness of less than 0.01 micron, in this example of approximately 0.002 micron (20 Angstrom) through which electrons or holes can tunnel. A first conductive layer 4 the floating gate, in this example an aluminum layer, but this may also be a layer of another metal, or, for example, a layer of polycrystalline silicon, is present on the oxide layer 3 and covers the thin part 3A thereon entirely. The layer 4 is surrounded entirely by electrically insulating material, for on the layer 4 there is a further layer 5 of electrically insulating material, in this example of pyrolytically deposited silicon oxide, which covers the layer 4 entirely also at the edge. The conductive layer 4 serves to store information-containing charge, for example, in the form of electrons, and since the layer 4 is surrounded entirely by electrically insulating material (3, 5), said charge can be stored for a long time on the metal layer 4.

A part 4B of the said first conductive layer 4 forms the gate electrode of an insulated gate field effect transistor (IGFET). The conductive layer 4 is separated from the channel region 6 of the field effect transistor by a part 3B of the insulating layer 3. The device furthermore comprises a second conductive layer 7 which has a connection conductor 8 in the form of an aluminum layer which joins the second conductive layer 7 via a window in the oxide layer 3. The second conductive layer 7 is separated from the said first conductive layer 4 by the electrically insulating material of the layer 3.

According to the invention, the second conductive layer 7 is formed by a first, p-type conductive surface zone which forms a p-n junction 9 with the n-type region 1 and, in projection (see FIG. 1) is present outside or laterally spaced from the channel region 6 of the field effect transistor, said surface zone 7 being separated from the first conductive layer 4 by an at least 0.01 micron thick, in this example approximately 0.015 microns (150 Angstrom) thick, part of the insulating layer 3, through which thus no charge carriers can tunnel. Furthermore, according to the invention, a second likewise p-type conductive surface zone 10 is present which has a connection conductor in the form of an aluminum layer 11 (see FIG. 1) which joins the second surface zone 10 via a window in the oxide layer 3. The surface zone 10 forms a p-n junction 12 with the n-type region 1 and is separated according to the invention from the first conductive layer 4 by a part of the insulating layer 3 which for a part (3A) is less than 0.01 micron thick, as already said in this example approximately 0.002 micron thick, through which part 3A electrons or holes can tunnel. According to the invention, the part 4B of the first conductive layer 4 which forms the gate electrode of the field effect transistor is separated from the channel region 6 by a part 3B of the insulating layer 3 having a thickness of at least 0.01 micron, through which thus no charge carriers can tunnel, in this example having a thickness of approximately 0.015 micron (150 Angstrom).

Although this is not necessary, the said second surface zone 10 advantageously, as in the example described here (see FIG. 2), is also a source or drain zone (in this case the drain zone) of the field effect transistor. In this example the source and drain zones of the field effect transistor are formed by the p-type zones 10 and 13 which join the aluminum layers 11 and 14, see FIGS. 1 and 2. In this manner a very compact structure is obtained. Furthermore, in this example, according to a preferred embodiment, the first surface zone 7 is separated from the second surface zone 10 by an oxide layer 3C which is provided by local or selective oxidation, is sunk in the semiconductor body at least partly, has a thickness of approximately 1 micron, adjoins and forms part of the other parts of the insulating layer 3 and is also provided elsewhere, the zones 7 and 10 and also the zone 13 joining said sunken oxide part 3C. This also makes the device more compact, although of course other embodiments are also possible.

The semiconductor storage device shown in FIGS. 1 through 3 can both be recorded and erased in the following manner by applying voltages and voltage pulses, respectively, originating from a voltage source of the same polarity relative to a reference potential, for example, relative to ground. For recording information, as is shown diagrammatically in FIG. 1, via the metal layers 8 and 11, the first surface zone 7 in the position A of the switch is set up at a positive potential relative to the second surface zone 10, the zone 10 in this example being set up at a reference potential, for example ground (although this is not necessary). Under the influence of the applied field, electrons tunnel from the zone 10 through the thin part 3A of the oxide layer 3 to the first conductive layer 4 where they are stored as negative information-containing charge. The recording voltage is then removed (position B of the switch).

For non-destructive reading of the information present, i.e., sensing the charge condition of the floating gate 4 (see FIG. 1), a voltage $V_D$ is applied between the source and drain zones 10 and 13 and a voltage which is negative relative to the channel region 6 is applied to the connection conductor 8 of such a value that no tunneling takes place across the layer part 3A. As a result of this, the gate electrode 4B of the field effect transistor, via the series arrangement of the two capacities formed, on the one hand by the layers 7, 3 and 4 and on the other hand by the layers 4 and 3 and the channel region 6, is also brought at a potential which is negative relative to the channel region 6, and when the threshold voltage is reached, an inversion channel is formed between the source and drain zones 10 and 13 so that the field effect transistor starts conducting current. The threshold voltage at which this occurs depends on the information-containing charge stored on the conductive layer 4 and hence is a measure of the presence or absence thereof.

Although the above-described way of reading relates to a field effect transistor of the so-called enhancement type, reading may also be carried out in an analogous manner when the field effect transistor is of the depletion type, so when an inversion channel between the source and drain zone is already present without a voltage at the gate electrode. In that case the threshold voltage is determined which is necessary to cut off the current between the source and drain zone, which threshold voltage also depends upon the charge present on the gate electrode.

Since the capacitor formed by the zone 7 and the layers 3 and 4 of the device according to the invention can have a comparatively large capacity, the voltage required for recording is rather low, in the order of a few volts, in contrast with the above-described known devices in which this is a few tens of volts. The capacitor (7, 3, 4) can be increased by increasing the surface area on the part of the insulating layer 3 present between the layers 4 and 7 and/or by reducing the thickness of said intermediate part of the layer 3, in which, however, said thickness must remain larger than 0.01 micron so as to avoid tunneling of charge carriers from the layer 7 to the layer 4, or conversely. The example described relates to a preferred embodiment of the invention in which the zone 7 is separated from the layer 4 by a part of the insulating layer 3 having a thickness of at most 0.02 micron, in this embodiment 0.015 micron.

For erasing the stored information the same voltage source is used with the position C of the switch. In this position the second surface zone 10 is at a positive potential relative to the first surface zone 7 so that information-containing electrons stored on the metal layer 4 flow back from the layer 4 to the zone 10 via a tunneling process through the thin part 3A of the insulating layer 3. In the device according to the invention erasing also occurs at a comparatively low voltage of only a few volts, while both for recording and for erasing as described above, use may be made of a voltage source having the same polarity relative to a reference potential (in this case ground), and no reversal of the polarity is necessary, which is an important advantage as compared with known devices.

Due to the low recording and erasing voltages, as well as due to the use of the same voltage polarities for recording and erasing, the device according to the invention is very suitable for integration in MOS circuits, for use in an integrated storage matrix.

The described device can be manufactured while using generally known semiconductor technologies. For providing sunken oxide layer parts, for example 3C, by means of local or selective oxidation, as well as for all masking and etching technologies to be used, reference is made to the article by Appels et al in Philips Research Reports, April, 1970, pp. 118 through 132.

The manufacture will be briefly described with reference to FIGS. 4 through 7. First (see FIG. 4) the sunken oxide pattern 3C is provided in the n-type silicon plate 1 while using a mask masking against oxidation and consisting of layers of silicon oxide 15 and silicon nitride 16 provided one on top of the other and patterned into the desired shape by means of an etching mask consisting of a layer 17 of silicon oxide. After removing the remainder of the layers 15, 16 and 17 with the exception of the part present above the channel region 5 and shown in FIG. 4, boron is indiffused to form the zones 7, 10 and 13. The silicon surface is then exposed entirely, with the exception of the part covered by the sunken oxide 3C, after which the further parts of the oxide layer 3, thickness 0.15 micron, are provided by thermal oxidation, in which oxide layer an aperture is then made above the zone 10, see FIG. 5. By oxidation at low temperature, for example 750° C in dry oxygen for 30 minutes, a thin oxide layer 3A, thickness 20 Angstrom (0.002 micron) is formed in the aperture (see FIG. 6). The aluminum layer 4 is then provided, etched in the desired shape, and covered with a pyrolytic silicon oxide layer 5, after which the contact windows are etched and the metallisation is provided. It will be obvious that this is only an example of a manner of manufacturing and that many variations to this are possible.

Although the embodiment described with reference to FIGS. 1 through 3 is a particularly suitable and compact embodiment of the invention, many other interesting embodiments are possible. In particular, the device according to the invention is suitable to be carried out in the so-called SOS technique, in which the various semiconductor regions and semiconductor zones constitute a monocrystalline layer which is provided on an electrically insulating support of a different material. FIG. 8, for example is a diagrammatic cross-sectional view of a device according to the invention of which the semiconductor body 1 is a monocrystalline silicon layer, in this example of the n-conductivity type, approximately 1 micron thick, which is grown on an insulating substrate 21 of, for example, sapphire in a manner known in semiconductor technology and in which the p-type surface zones 7, 10 and 13 are provided by doping, for example, by means of diffusion, which zones extend throughout the thickness of the silicon layer. The various layers and zones shown have the same function and the same conductivity type as the correspondingly numbered layers and zones of the example shown in FIGS. 1 through 3. Instead of a sunken oxide layer part, the oxide layer 3 in this case forms a comparatively thick (at least a few tenths of microns) part between the first surface zone 7 and the second surface zone 10. The thicknesses of the remaining parts of the insulating layer 3, in particular of the part 3A and of the part between the layers 4 and 7, may be the same again as those in the first embodiment. The p-type zone 10 used as a source or drain zone has, outside the plane of the drawing and outside the metal layer 4 surrounded entirely by the insulating layers 3 and 5, a connection conductor in a manner analogous to that of the example shown in FIGS. 1 through 3. This device also can be manufactured by means of methods conventionally used in semiconductor technology and is operated in the same manner as the device shown in FIGS. 1 through 3.

A cross-sectional view of again another embodiment is shown diagrammatically in FIG. 9. This device differs from that shown in FIG. 8 inter alia in that the semiconductor layer is divided into two non-coherent parts by locally oxidizing the semiconductor layer entirely so that the two parts of the layer are separated by a sunken oxide part 3C. Such a separation can of course also be obtained by etching the semiconductor layer locally down to the sapphire substrate 21, providing the separated parts of the semiconductor layer with an insulating layer, and providing the layer 4 on said insulation layer and on the sapphire substrate. For the rest, the various layers and zones again have the same function as the correspondingly referenced ones of FIGS. 1 through 8, while their dimensions, their dopings and their way of connection if desired may also be the same as those in the preceding Examples.

Although in the device shown in FIG. 9 a very good insulation is obtained between the surface zone and the field effect transistor, it will in practice usually be preferred to construct the device so that the semiconductor regions and semiconductor zones form part of one coherent semiconductor body, as is shown in the examples of FIGS. 1 through 8. Another example of such a monolythic device is shown diagrammatically in the cross-sectional view of FIG. 10. This embodiment is distinguished from the preceding examples inter alia in that the second surface zone, in this example the p-type zone 10, is not at the same time a source or drain zone of the field effect transistor, but is constructed as a separate zone. In this embodiment the p-type zone 10 and the p-type zone 31, which is a source or drain zone of the field effect transistor, are each provided with a connection conductor both outside the plane of the drawing and outside the conductive layer 4 enveloped entirely by insulation material (3, 5). Recording and erasing is carried out again by applying voltages and voltage pulses, respectively, between the zones 7 and 10 in a manner similar to that described with reference to FIG. 1. In this example the reading circuit is separated entirely from the recording and erasing circuit, which in certain circumstances may be of advantage but is done at the expense of less compactness as compared with devices in which the second surface zone above which the thin part of the insulating layer through which charge carriers can tunnel is present, is also a source or drain zone of the field effect transistor.

It will be obvious that the invention is not restricted to the embodiments described but that many variations are possible to those skilled in the art without departing from the scope of this invention. For example, semiconductor materials other than silicon, for example, germanium or $A_{III}$-$B_V$ compounds, for example GaAs, may be used. The insulating layers 3 and 5 which in the examples were silicon oxide layers of a homogeneous composition, may consist fully or partly of other materials, for example, of silicon nitride or aluminum oxide. The support of an embodiment such as that of FIGS. 8 and 9 need not consist of sapphire but may also be, for example, another suitable insulating substrate having a spinel structure. In all the examples the conductivity type of all the semiconductor zones collectively may be reversed while simultaneously reversing the polarity of the voltages to be applied. The semiconductor substrate (1) need not be connected but is in general set up at such a reference potential that no voltage in the forward direction can be across any of the p-n junctions.

Finally it is to be noted that the terms "recording" and "erasing" can be interchanged. What matters is only that the storage device can be brought from one possible state into the other possible state, and conversely. Whether a given threshold voltage corresponds to an information 1 or 0 depends upon the use of the device.

What is claimed is:

1. A floating gate solid state storage device comprising a body having a semiconductor region of first type conductivity and first and second surface zones of second type conductivity, a first insulator portion through which charge carriers can tunnel on the surface of the second zone, a second insulator portion through which charge carriers cannot tunnel covering entirely the surface of the first zone, an isolated floating gate electrode on the first and second insulator portions and overlying the first and second zones and capacitively coupled thereto, means for applying a potential between the first and second zones sufficient to cause transfer of charge carriers to and from the floating gate through the first insulator portion by tunneling for storing a charge condition, and means connected to the device for sensing the charge condition of the floating gate.

2. A storage device as claimed in claim 1 wherein the first and second surface zones form P-N junctions with the semiconductor region, the first insulator portion is less than 0.01 micron thick, the second insulator portion is greater than 0.01 micron thick, and the charge sensing means comprises an insulated gate field effect transistor having source and drain zones defining a channel region and a gate electrode over the channel and spaced therefrom by a third insulating portion having a thickness greater than 0.01 microns, the transistor gate electrode being connected to the floating gate, and the first and second surface zones and the channel region being located substantially in the same plane in lateral relationship.

3. A storage device as claimed in claim 2, wherein the second surface zone of the second conductivity type also constitutes the source or drain zone of the field effect transistor.

4. A storage device as claimed in claim 2 wherein the first surface zone is separated from the second surface zone by an oxide layer which is inset at least partly in the body.

5. A storage device as claimed in claim 2 wherein the thickness of the second insulator portion is at most 0.02 micron.

6. A storage device as claimed in claim 2 wherein the semiconductor region and zones are part of a common monocrystalline layer provided on an electrically insulating support.

7. A storage device as claimed in claim 6, wherein the said surface zones of the second conductivity type extend throughout the thickness of the semiconductor layer.

8. A storage device as claimed in claim 2 wherein the semiconductor region and semiconductor zones form part of one coherent semiconductor body.

9. A storage device as claimed in claim 2 and further comprising a voltage source having a given polarity relative to a reference potential and first and second terminals, means for connecting the first surface zone to the first terminal and the second surface zone to the second terminal for recording information, and means for connecting the first surface zone to the second terminal and the second surface zone to the first terminal for erasing information, and means for applying voltages to the field effect transistor for sensing the information condition of the device.

* * * * *

UNITED STATES PATENT AND TRADEMARK OFFICE
CERTIFICATE OF CORRECTION

PATENT NO. : 4,019,197
DATED : April 19, 1977
INVENTOR(S) : JAN LOHSTROH ET AL

It is certified that error appears in the above-identified patent and that said Letters Patent are hereby corrected as shown below:

Column 2, line 17, cancel "and hence to vary the"
line 18, cancel "threshold voltage of the field"

Signed and Sealed this fifth Day of July 1977

[SEAL]

Attest:

RUTH C. MASON
Attesting Officer

C. MARSHALL DANN
Commissioner of Patents and Trademarks